United States Patent [19]

Allgood et al.

[11] Patent Number: 4,472,647

[45] Date of Patent: Sep. 18, 1984

[54] CIRCUIT FOR INTERFACING WITH BOTH TTL AND CMOS VOLTAGE LEVELS

[75] Inventors: Robert N. Allgood; Stephen H. Kelley; Richard W. Ulmer, all of Austin, Tex.

[73] Assignee: Motorola, Inc., Schaumburg, Ill.

[21] Appl. No.: 409,816

[22] Filed: Aug. 20, 1982

[51] Int. Cl.³ ............... H03K 19/094; H03K 17/30; H03K 17/693

[52] U.S. Cl. ............... 307/475; 307/360; 307/469

[58] Field of Search ............... 307/443, 446, 451, 473, 307/468–469, 475, 351, 354, 360, 576, 579, 585, 264, 296 R; 364/716

[56] References Cited

U.S. PATENT DOCUMENTS

| | | | |
|---|---|---|---|
| 4,032,795 | 6/1977 | Hale | 307/446 |
| 4,242,604 | 12/1980 | Smith | 307/443 |
| 4,287,439 | 9/1981 | Leuschner | 307/297 |
| 4,342,926 | 8/1982 | Whatley | 307/297 |
| 4,380,710 | 4/1983 | Cohen et al. | 307/451 |
| 4,392,067 | 7/1983 | Price, Jr. | 307/475 |

Primary Examiner—Larry N. Anagnos
Assistant Examiner—David R. Hudspeth
Attorney, Agent, or Firm—Anthony J. Sarli, Jr.; Jeffrey Van Myers; Robert L. King

[57] ABSTRACT

A voltage compatible circuit for providing TTL and CMOS level inputs and/or outputs is provided. An input signal level detection portion generates either a CMOS or a TTL mode signal in response to a voltage level selection signal. One or more input buffers and/or output buffers is coupled to the CMOS and TTL mode signals. The input buffers are responsive to input signals within predetermined CMOS voltage levels in response to a voltage level signal having at least a predetermined value determined by the input signal level detection portion and within predetermined TTL voltage levels otherwise. The output buffers provide output signals within predetermined CMOS voltage levels in response to a voltage level signal having at least a predetermined value determined by the input signal level detection portion and within predetermined TTL voltage levels otherwise. A reference voltage portion and a bias generator portion are coupled to the input and output buffers to provide the predetermined voltage levels.

9 Claims, 6 Drawing Figures

| PD | VLS | TTL MODE CONTROL | CMOS MODE CONTROL | MODE |
|----|-----|------------------|-------------------|------|
| 1 | DOES NOT MATTER | 0 | 0 | POWER DOWN |
| 0 | LESS THAN $V_{DD}-4.0V$ | 1 | 0 | TTL |
| 0 | GREATER THAN $V_{DD}-1.0V$ | 0 | 1 | CMOS |

CIRCUIT FOR INTERFACING WITH BOTH TTL AND CMOS VOLTAGE LEVELS

TECHNICAL FIELD

This invention relates generally to electronic circuits which can accomodate various power supplies and input and output voltage levels, and, more particularly, to electronic circuits having inputs and outputs which are functional at both TTL and CMOS voltage levels.

BACKGROUND ART

Two conventional types of circuitry which are used in integrated electronic circuits are transistor-transistor logic (TTL) and complementary metal oxide semiconductor (CMOS). Because TTL and CMOS circuits use different power supply voltages they cannot be freely intermingled. Typically, TTL logic circuits have a logic low trip point of no greater than 0.8 volt to guarantee a logic low and a logic high trip point of at least 2.0 volts to guarantee a logic high. However, CMOS logic circuits have a trip point at approximately one-half of the power supply voltage which is typically either ±5, ±6, or +12 volts. TTL circuits typically utilize 5 volt power supplies. Therefore, various power supply configurations are required when TTL circuits are used with CMOS circuits. Others have used a conventional CMOS inverter with a 5 volt power supply which can accept both TTL and CMOS logic level inputs. However, such circuits are limited to 5 volt power supply configurations and are relatively slow for many applications. Integrated circuits which allow use of different power supply voltages and which can accomodate TTL or CMOS inputs in response to a control signal and provide a CMOS output are also known. One such circuit which is commercially available is the MC 14414 sold by Motorola, Inc. However, such circuits do not provide both inputs and outputs with CMOS or TTL voltages and generally have a limited range of control voltages which provide a TTL level of operation.

BRIEF SUMMARY OF THE INVENTION

It is an object of the present invention to provide an improved circuit which has inputs and outputs which interface with both CMOS and TTL circuits in response to a voltage selection signal.

Another object of the present invention is to provide a TTL/CMOS voltage compatible circuit capable of operation at various power supply potentials.

A further object of the present invention is to provide a circuit which is responsive to an input signal within predetermined CMOS voltage levels in response to a voltage selection signal having at least a predetermined value and within predetermined TTL voltage levels otherwise.

Yet another object of the present invention is to provide a circuit which provides an output signal within predetermined CMOS voltage levels in response to a voltage selection signal having at least a predetermined value and within predetermined TTL voltage levels otherwise.

In carrying out the above and other objects of the present invention, there is provided, in one form, a voltage compatible circuit responsive to an input signal within predetermined CMOS voltage levels in response to a voltage level selection signal having at least a predetermined value and within predetermined TTL voltage level inputs otherwise. The voltage compatible circuit has input detection means which provide either a CMOS mode control signal or a TTL mode control signal in response to the value of the voltage level selection signal. The voltage level selection signal is also coupled to reference voltage means which provide reference voltages which track the voltage level selection signal. Input buffer means are coupled to both the input detection means and the reference voltage means for providing an input buffer output signal in response to the CMOS and TTL mode control signals which are indicative of the state of said input signal relative to either the CMOS voltage levels or the TTL voltage levels. Output buffer means are coupled to both the input detection means and the reference voltage means for providing a circuit output signal indicative of the state of input data and having either CMOS voltage levels or TTL voltage levels in response to the CMOS and TTL mode control signals.

The above and other objects, features and advantages of the present invention will be more clearly understood from the following detailed description taken in conjunction with the accompanying drawings.

DESCRIPTION OF THE PREFERRED EMBODIMENT

Figure 1:
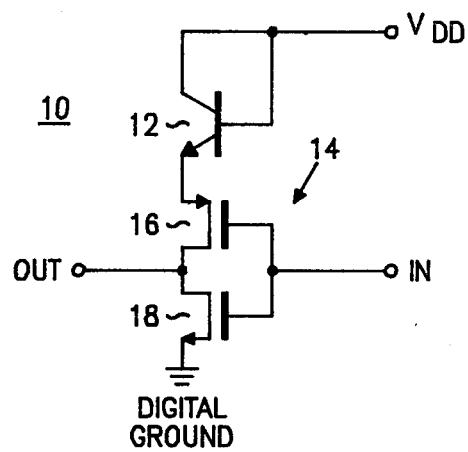
FIG. 1 illustrates in schematic form a TTL/CMOS voltage compatible circuit.

Shown in FIG. 1 is a TTL/CMOS voltage compatible circuit 10. Circuit 10 comprises a bipolar transistor 12 having a collector electrode and a base electrode connected together and coupled to a supply voltage, $V_{DD}$, having a value for example of five volts. A CMOS inverter section 14 comprises a P-channel MOS transistor 16 and an N-channel MOS transistor 18. Transistor 16 has a source electrode connected to an emitter electrode of transistor 12, and transistor 18 has a source electrode coupled to a digital ground reference. Gate electrodes of transistors 16 and 18 are connected together to form an input terminal, and drain electrodes of transistors 16 and 18 are connected together to form an output terminal.

In operation, transistors 16 and 18 have the gate dimensions thereof ratioed to one another to obtain a known switchpoint within the conventional TTL specification of 0.8 volt to 2.0 volts for TTL input voltages. The predetermined switchpoint is set by the known voltage drop across transistor 12 and by known voltage drops across transistors 16 and 18 as a result of the ratioing. To obtain the desired switchpoint, P-channel transistor 16 has a gate region having a small width to length dimension ratio and is therefore considered a weak device. N-channel transistor 18 has a gate region having a large width to length dimension ratio and is therefore considered a strong device. As a result of the difference in relative strengths of transistors 16 and 18 of CMOS inverter 14, circuit 10 switches slowly and is very process variable. Circuit 10 which comprises CMOS inverter 14 will also work for CMOS threshold voltage inputs when $V_{DD}$ is a five volt supply voltage. However, circuit 10 will not accurately switch for both TTL and CMOS voltage inputs when $V_{DD}$ is any voltage greater than five volts.

Figure 2:
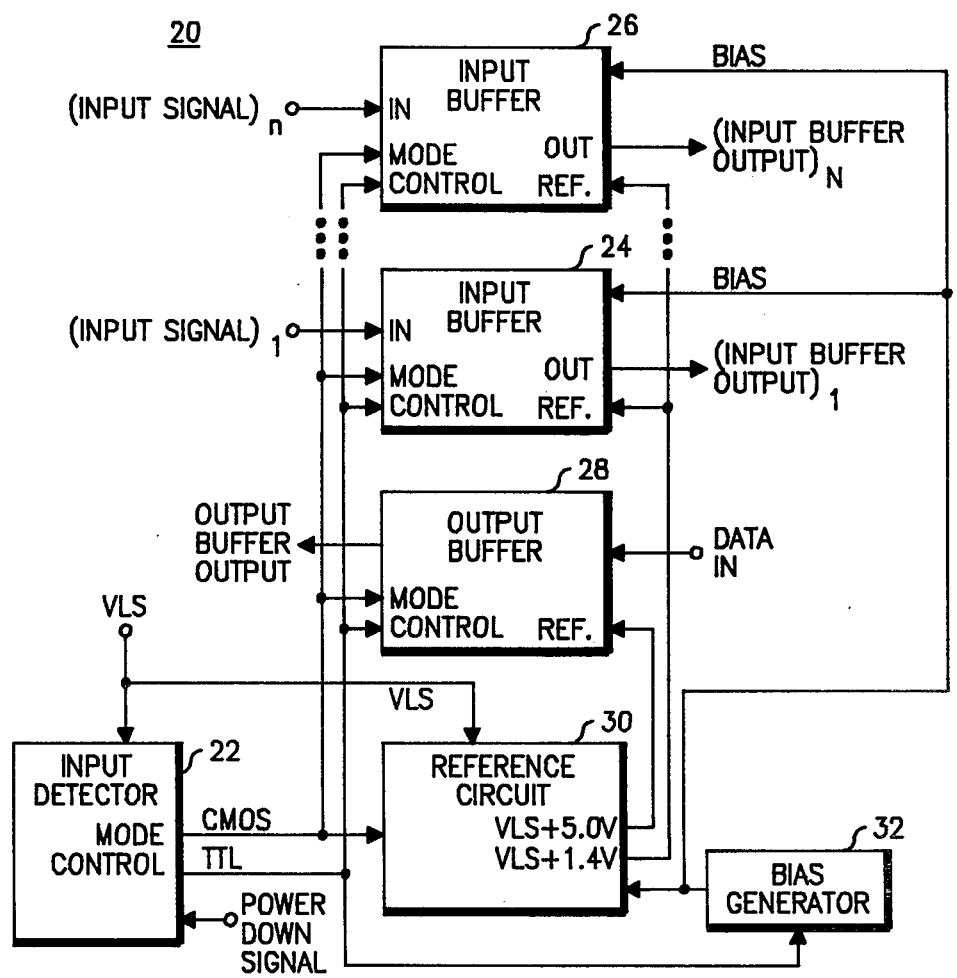
FIG. 2 illustrates in block diagram form a TTL/CMOS voltage compatible circuit in accordance with a preferred embodiment of the present invention.

Shown in FIG. 2 is a block diagram of a TTL/CMOS voltage compatible circuit 20 constructed in accordance with a preferred embodiment of the present invention. Circuit 20 comprises an input detector 22 which has a first input coupled to a voltage level selection signal (VLS) and a second input coupled to a power down signal for reducing current consumption in circuit 20. Input detector 22 provides two mode control signals, a CMOS mode control signal and a TTL mode control signal, depending upon the value of the voltage level selection signal and the state of the power down signal. Both CMOS and TTL mode control signals are coupled to a plurality of n input buffers, such as input buffers 24 and 26. Each of the n input buffers has an input signal coupled to an input terminal. Each input signal can have either TTL or CMOS voltage levels depending upon the value of the VLS signal. Each of the n input buffers provides a CMOS compatible output signal. Both CMOS and TTL mode control signals are also coupled to an output buffer 28. Output buffer 28 has an input for accepting a data signal which has a CMOS compatible voltage level. Depending upon which mode control signal is received, output buffer 28 provides an output which is either within TTL or CMOS voltage levels. Assuming the power down signal is not present, when the VLS signal is in the CMOS command range, input detector 22 provides a CMOS mode control signal which enables the n input buffers to receive a respective CMOS input signal and which enables the output buffer to provide a CMOS output signal. If the VLS signal is in the TTL command range, the VLS signal will cause input detector 22 to provide the TTL mode control signal which enables the n input buffers to receive a respective TTL input signal and the output buffer to provide a TTL output signal with the particular value of VLS being digital ground. Having VLS as digital ground in the TTL mode insures that the TTL level outputs which are provided are within the conventional values. A reference circuit 30 has inputs coupled to the VLS signal and to the CMOS mode control signal. Reference circuit 30 provides fixed voltages referenced to the value of the VLS signal to all input and output buffers. Many known reference circuits may be used for reference circuit 30, one of which is taught in U.S. Pat. No. 4,287,439, entitled "MOS Bandgap Reference" by Horst Leuschner. A bias generator circuit 32 is coupled to reference circuit 30 and to input buffers 26 and 28 to provide a constant bias voltage. Many known bias generator circuits may be used for generator circuit 32, one of which is taught in U.S. Pat. No. 4,342,926, entitled "Bias Current Reference Circuit".

Figure 3:
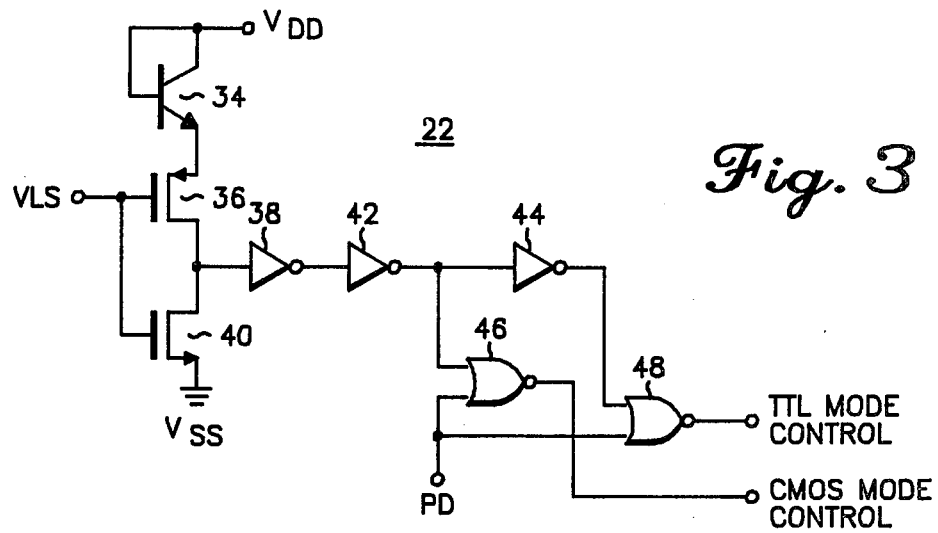
FIG. 3 illustrates in schematic and logic diagram form an input detector circuit shown in FIG. 2.

Shown in FIG. 3 is a schematic embodiment and associated truth table of input detector 22. While specific N-channel and P-channel devices are shown and described throughout the detailed description, it should be clear that this invention could be implemented by completely reversing the processing techniques (e.g. P-channel to N-channel) or by using other types of transistors. An NPN bipolar transistor 34 has a collector and a base electrode connected together and coupled to a supply voltage $V_{DD}$. An emitter electrode of transistor 34 is coupled to a source electrode of a P-channel transistor 36. Transistor 36 has a gate electrode coupled to the VLS signal and a drain electrode coupled to both an input of an inverter 38 and to a drain electrode of an N-channel transistor 40. A source electrode of transistor 40 is connected to the substrate thereof and coupled to a reference voltage terminal illustrated as supply voltage $V_{SS}$. A gate electrode of transistor 40 is connected to the gate electrode of transistor 36 and coupled to the VLS signal. An output of inverter 38 is connected to an input of an inverter 42. An output of inverter 42 is coupled to both an input of an inverter 44 and to a first input of a NOR gate 46. A second input of NOR gate 46 is coupled to a power down signal, PD. An output of inverter 44 is coupled to a first input of a NOR gate 48. A second input of NOR gate 48 is coupled to power down signal PD, and the output of NOR gate 48 provides the TTL mode control signal.

Transistors 34, 36 and 40 differ from the TTL/CMOS voltage compatible circuit 10 of FIG. 1 in several key respects. Transistor 36 is intentionally fabricated with a large width to length ratio gate dimension to be a strong transistor. Conversely, transistor 40 is fabricated with a very small width to length ratio gate dimension. Therefore, the input of the inverter formed by transistors 36 and 40 has a high trip point. The small gate width to length ratio of transistor 40 also insures that current consumption is low. The purpose of transistor 34 is to provide additional noise margin in the switching of transistors 36 and 40 by the VLS signal. The CMOS mode control signal will be present as long as the VLS signal is within about one volt of $V_{DD}$ if circuit 20 is not powered down.

The operation of input detector 22 may be better understood by referring to the truth table of FIG. 3. When power down signal PD is at a logic high level, detector 22 is in a power down mode and both the TTL and CMOS mode control signals are at a logic low level. When power down signal PD is at a logic low level, detector 22 is providing either a TTL or a CMOS mode control signal, depending upon the value of the VLS signal. When the VLS signal is within one volt of supply voltage $V_{DD}$, transistor 36 is biased off completely and transistor 40 is biased on to couple a logic low signal to the first input of NOR gate 46 and a logic high signal to the first input of NOR gate 48 which provides the CMOS mode control signal. When the VLS signal is lower than four volts below supply voltage $V_{DD}$, transistor 36 is biased on more strongly than transistor 40 to couple a logic high signal to the first input of NOR gate 46 and a logic low signal to the first input of NOR gate 48. Therefore, the output of NOR gate 48 is at a high logic level to provide a TTL mode control signal and the output of NOR gate 46 is at a logic low level. A variety of power supply potentials may be used for $V_{DD}$ thereby allowing large design flexibility. Without transistor 34, transistor 36 would be turned on whenever VLS is within a threshold voltage, $V_T$, of $V_{DD}$. This would allow switching into the CMOS mode for only a very narrow range of VLS control voltage within about one-half volt of $V_{DD}$. Therefore, transistor 34 drops the switchpoint of circuit 22 about another one-half volt so that circuit 22 will be in the CMOS mode when VLS is within one volt of $V_{DD}$ rather than only one-half a volt.

Figure 4:
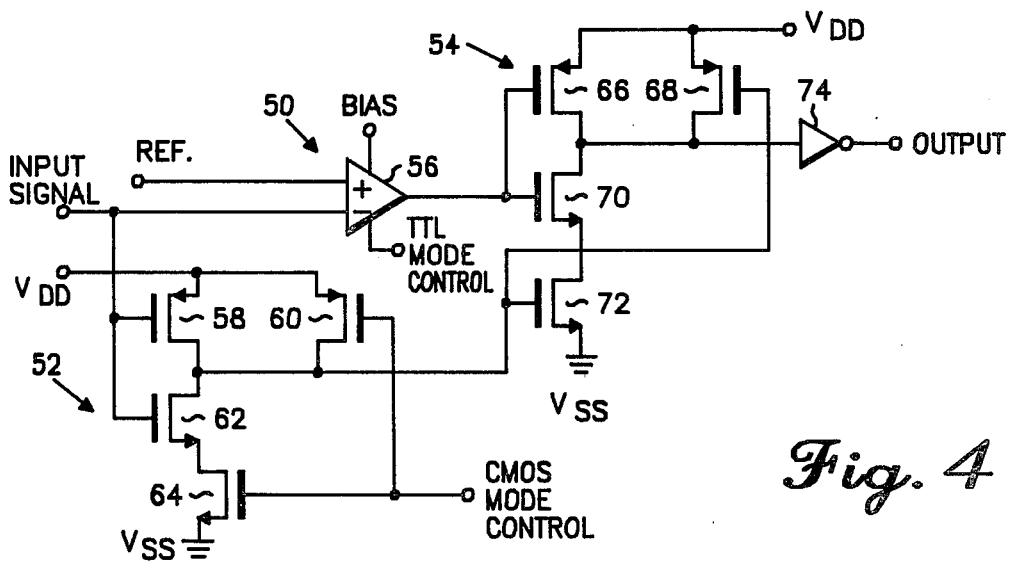
FIG. 4 illustrates in schematic form an input buffer circuit shown in FIG. 2.

Shown in FIG. 4 is a schematic diagram of an input buffer such as input buffers 24 and 26 of FIG. 2. The input buffer shown comprises a comparator portion 50, a NAND gate portion 52 and a NAND gate portion 54. Comparator portion 50 comprises a differential amplifier 56 having a noninverting input coupled to a reference voltage from reference circuit 30 which is substantially equal to the $V_{LS}$ signal plus 1.4 volts. An inverting input of differential amplifier 56 is coupled to an input signal. Differential amplifier 56 also has inputs coupled to the bias voltage from bias generator 32 (shown in FIG. 2) and to the TTL mode control signal from input detector 22.

NAND gate portion 52 comprises a P-channel transistor 58 having a source electrode coupled to a supply voltage $V_{DD}$, a gate electrode coupled to an input signal, and a drain electrode. A P-channel transistor 60 has a source electrode coupled to both supply voltage $V_{DD}$ and to the source electrode of transistor 58. A gate electrode of transistor 60 is coupled to the CMOS mode control signal provided by input detector 22, and a drain electrode connected to the drain electrode of transistor 58. An N-channel transistor 62 has a drain electrode connected to both drain electrodes of transistors 58 and 60, a gate electrode coupled to both the gate of transistor 58 and the input signal, and a source electrode. An N-channel transistor 64 has a drain electrode connected to the source electrode of transistor 62, a gate electrode coupled to both the CMOS mode control signal and the gate electrode of transistor 60, and a source electrode coupled to supply voltage $V_{SS}$.

NAND gate portion 54 comprises P-channel transistors 66 and 68 and N-channel transistors 70 and 72. Associated with NAND gate portion 54 is an inverter 74 which buffers the output. P-channel transistor 66 has a source electrode coupled to supply voltage $V_{DD}$, a gate electrode coupled to both an output of differential amplifier 56 and to a gate electrode of transistor 70, and a drain electrode. P-channel transistor 68 has a source electrode coupled to supply voltage $V_{DD}$ and to the source electrode of transistor 66, a drain electrode connected to both the drain electrodes of transistors 66 and 70 and to an input of inverter 74, and a gate electrode connected to the drain electrodes of transistors 58, 60 and 62, and to a gate electrode of transistor 72. N-channel transistor 70 has a drain electrode also connected to an input of inverter 74, a gate electrode also connected to the output of differential amplifier 56, and a source electrode. N-channel transistor 72 also has a gate electrode connected to the gate electrode of transistor 68 and to the drain electrodes of transistors 58, 60 and 62. A source electrode of transistor 72 is coupled to supply voltage $V_{SS}$. An output of inverter 74 provides an input buffer output signal.

In operation, the input buffer of FIG. 4 may accept either a TTL voltage level or a CMOS voltage level input signal and will provide a CMOS voltage level output signal. Assume, for the purpose of illustration only, that the input buffer of FIG. 4 receives a CMOS voltage level input signal because the CMOS mode control signal is at a logic high level and the TTL mode control signal is at a logic low level. When the TTL mode control signal is a logic low, differential amplifier 56 is disabled and the output of differential amplifier 56 which is coupled to NAND gate portion 54 is a logic high. The effect of disabling differential amplifier 56 is to make the output of inverter 74 totally dependent on the logic level of the signal coupled to the gate electrodes of transistors 68 and 72 of NAND gate portion 54. Since the CMOS mode control signal is at a logic high level, transistor 60 is nonconducting and transistor 64 is conducting. The effect of this is to simply reduce NAND gate portion 52 to a logic inverter comprising transistors 58 and 62. Therefore, a CMOS voltage level input signal having a high logic level will cause a low logic level to be coupled to transistors 68 and 72. Transistor 72 is made nonconducting and transistor 68 is made conducting. Therefore, the output of inverter 74 is a CMOS level logic low of $V_{SS}$ potential. The voltages $V_{DD}$ and $V_{SS}$ may be varied according to design preference. Similarly, a CMOS voltage level input signal having a low logic level will cause a high logic level to be coupled to transistors 68 and 72. Transistor 72 is made conducting and transistor 68 is made nonconducting. Therefore, the output of inverter 74 is a CMOS voltage level logic high of $V_{DD}$ potential.

When the input buffer of FIG. 4 changes into a TTL mode of operation, the TTL mode control signal becomes a logic high level signal and the CMOS mode control signal becomes a logic low level signal. The effect of this is to enable differential amplifier 56 and make transistor 60 conductive and transistor 64 nonconductive, thereby coupling a logic high level to the gate electrodes of transistors 68 and 72. The effect of coupling a logic high level signal to the gate of transistor 72 is that the input of inverter 74 is totally dependent on the logic level of the signal coupled to the gate electrodes of transistors 66 and 70. When the logic level of the output of differential amplifier 56 is at a high level, the input of inverter 74 is at a low logic level, and when the logic level of the output of differential amplifier 56 is at a low level, the input of inverter 74 is at a high logic level. The reference voltage coupled to the noninverting input of differential amplifier 56 is equal to VLS + 1.4 volts. Using this particular reference voltage has the effect of causing differential amplifier 56 to switch logic states from a high level to a low level only when the input signal at the inverting input exceeds 1.4 volts above VLS. Use of this reference voltage also allows the VLS voltage to be a digital ground for the TTL mode of operation. Thus a varying digital ground may be used if different VLS signals are used.

When the input buffer of FIG. 4 is in a power down mode of operation, both the TTL and CMOS mode control signals are at a low logic level. The output of inverter 74 is a logic low level and the entire input buffer is powerless. The inputs are locked up regardless of whether the input signal is floating or not. Furthermore, clock inputs to the input buffer of FIG. 4 may also be free-running and not disabled without wasting current in the input buffer.

Figure 5:
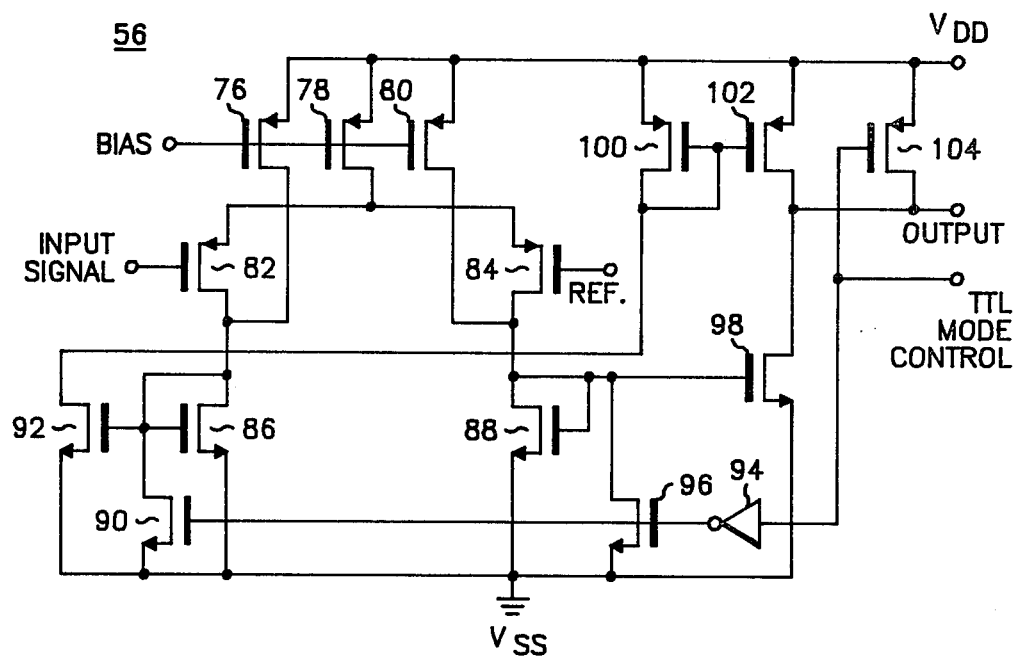
FIG. 5 illustrates in schematic form a comparator circuit shown in FIG. 4.

Shown in FIG. 5 is a schematic diagram of differential amplifier 56 of FIG. 4 which functions as a comparator and level shifter. P-channel transistors 76, 78 and 80 have the gate electrodes thereof coupled to a bias voltage signal provided by bias generator 32 shown in FIG. 2. Transistors 76, 78 and 80 each have a source electrode coupled to a supply voltage $V_{DD}$. P-channel transistors 82 and 84 each have a source electrode coupled to a drain electrode of transistor 78. A gate electrode of transistor 82 is coupled to an input signal, and a gate electrode of transistor 84 is coupled to the reference voltage $V_{LS}$ + 1.4 volts provided by reference circuit 30 (FIG. 2). A drain electrode of transistor 82 is connected to both the drain electrode of transistor 76 and to a gate electrode and a drain electrode of an N-channel transistor 86. A source electrode of transistor 86 is coupled to a supply voltage $V_{SS}$. A drain electrode of transistor 84 is connected to the drain electrode of transistor 80 and to both a gate electrode and a drain electrode of an N-channel transistor 88. A source electrode of N-channel transistor 88 is coupled to supply voltage $V_{SS}$. An N-channel transistor 90 has a drain electrode connected to the gate and drain electrodes of transistor 86 and to a gate electrode of an N-channel transistor 92, a source electrode coupled to supply voltage $V_{SS}$, and a gate electrode connected to the output of an inverter 94. An N-channel transistor 96 has a drain electrode connected to the gate and drain electrodes of transistor 88, to the drain electrode of transistor 84, to the drain electrode of transistor 80, and to a gate electrode of a transistor 98. A gate electrode of transistor 96 is connected to the output of inverter 94, and a source electrode of transistor 96 is coupled to supply voltage $V_{SS}$. A P-channel transistor 100 has a source electrode coupled to supply voltage $V_{DD}$, and a gate and drain electrode connected together and to the drain electrode of transistor 92. A P-channel transistor 102 has a source electrode coupled to supply voltage $V_{DD}$, a gate electrode connected to the gate and drain electrodes of transistor 100 and to the drain electrode of transistor 92, and a drain electrode which is connected to both an output terminal and the drain electrode of transistor 98. A P-channel transistor 104 has a source electrode coupled to supply voltage $V_{DD}$, a gate electrode connected to an input of inverter 94, and a drain electrode connected to both the output terminal and the drain electrodes of transistors 98 and 102. The TTL mode control signal from input detector 22 is coupled to the gate of transistor 104 and an input of inverter 94. Transistor 92 has its source electrode connected to supply voltage $V_{SS}$.

In operation, the gate electrode of transistor 82 functions as an inverting input and the gate electrode of transistor 84 functions as a noninverting input. Transistor 78 functions as a constant current source to transistors 82 and 84, and transistors 76 and 80 function as small additional current sources to transistors 86 and 88 and prevent the drain voltages of transistors 86 and 88 from dropping all the way to $V_{SS}$ with a large differential voltage on the gates of transistors 82 and 84. Transistor 92 is used to mirror a current, which is flowing through transistor 86, and used to establish a proportional current through transistor 102. Transistor 88 is used to mirror a current which is proportional to the current flowing through transistor 88 through transistor 98.

When differential amplifier 56 receives a low level TTL mode control signal, transistor 104 becomes conductive and couples supply voltage $V_{DD}$ to the output. Regardless of what input signal is received, the output of differential amplifier 56 will remain a logic high signal indicating that the input buffer is in either a CMOS mode of operation or is powered down. When the TTL mode control signal is at a logic low level, transistors 90 and 96 of differential amplifier 56 are made conducting thereby making transistors 86 and 98 nonconducting, respectively. The current mirrors formed by transistors 86 and 92 and transistors 88 and 98 are made nonfunctional. The bias voltage applied to the gate electrodes of transistors 76, 78 and 80 is equal to $V_{DD}$ when the TTL mode control signal is at a logic low level to make transistors 76, 78 and 89 completely nonconductive.

When differential amplifier 56 receives a high level TTL mode control signal, transistor 104 is made nonconductive and transistors 90 and 96 are nonconductive so that transistors 86 and 88 become functional. When the input signal exceeds the reference voltage, more current flows through transistors 84 and 88 than through transistors 82 and 86. As a result, transistor 98 is made more conductive than transistor 102 and a low logic level output is provided. When the input signal is less than the reference voltage, more current flows through transistors 82 and 86 than through transistors 84 and 88 so that transistor 102 is made more conductive than transistor 98 to provide a high logic level output. Transistors 102 and 98 function as a level shifter with gain to provide output voltages of approximately $V_{DD}$ and $V_{SS}$ depending upon the value of the input signal. Since the reference voltage is VLS+1.4 volts, the input signal may have a TTL voltage level with VLS as a digital ground reference.

Figure 6:
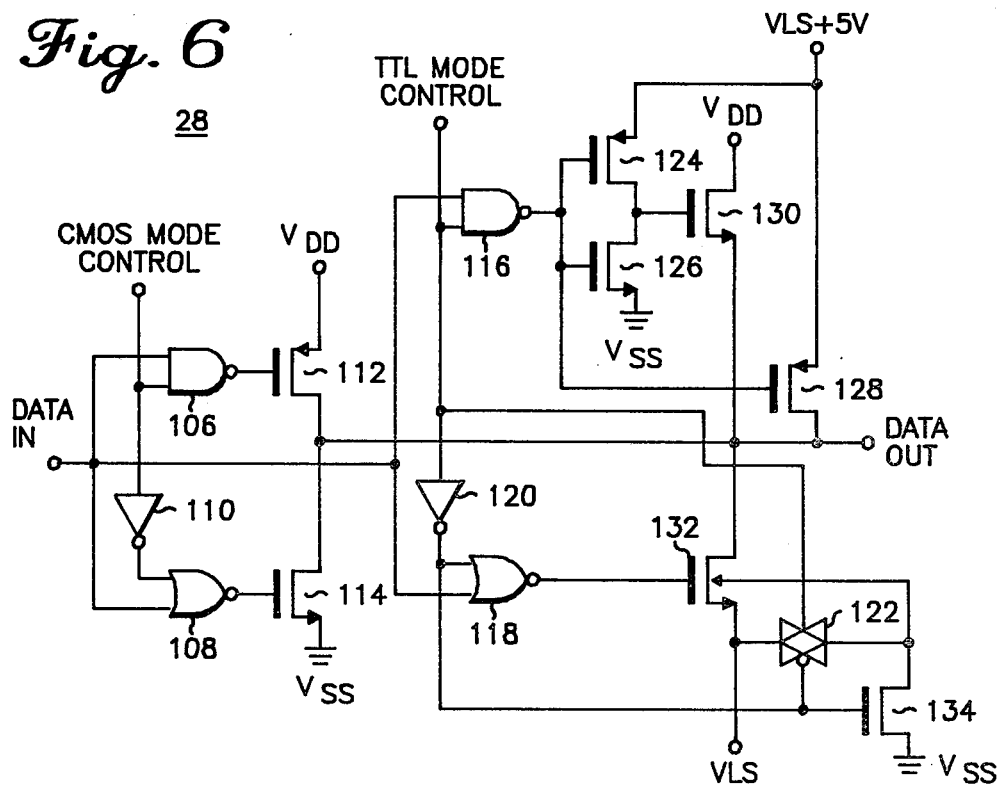
FIG. 6 illustrates in schematic and logic diagram form an output buffer circuit shown in FIG. 2.

Shown in FIG. 6 is a schematic diagram of output buffer 28 of FIG. 2. A NAND gate 106 has a first input coupled to both an input data terminal and a first input of a NOR gate 108. A second input of NAND gate 106 is coupled to the CMOS mode control signal from input detector 22 and to an input of an inverter 110. An output of inverter 110 is connected to a second input of NOR gate 108. An output of NAND gate 106 is connected to a gate electrode of a P-channel transistor 112, and an output of NOR gate 108 is connected to a gate electrode of an N-channel transistor 114. A source electrode of P-channel transistor 112 is coupled to a supply voltage $V_{DD}$ and a drain electrode is connected to a data output terminal and to a drain electrode of N-channel transistor 114. A source electrode of transistor 114 is coupled to supply voltage $V_{SS}$. A NAND gate 116 has a first input coupled to the input data signal and to a first input of a NOR gate 118. A second input of NAND gate 116 is coupled to an input of an inverter 120, to an N-type control electrode of a switch 122 and to the TTL mode control signal. An output of inverter 120 is connected to a second input of NOR gate 118 and to a P-type control electrode of switch 122. An output of NAND gate 116 is connected to gate electrodes of a P-channel transistor 124, an N-channel transistor 126 and a P-channel transistor 128. Transistor 124 has a source electrode coupled to reference voltage VLS+5 volts which is provided by reference circuit 30 of FIG. 2, a gate electrode connected to the gate electrodes of transistors 126 and 128 and to the output of NAND gate 116, and a drain electrode connected to a drain electrode of transistor 126 and to a gate electrode of an N-channel transistor 130. A source electrode of transistor 126 is coupled to supply voltage $V_{SS}$. Transistor 128 has a source electrode coupled to reference voltage VLS+5 volts and to the source of transistor 124, and a drain electrode connected to the data output terminal, to the drain electrodes of transistors 112, 114 and 132, and to the source of transistor 130. Transistor 132 has a gate electrode connected to an output of NOR gate 118, and a source electrode connected to both a first terminal of switch 122 and the voltage level selection signal, VLS. A substrate terminal of transistor 132 is connected to a second terminal of switch 122 and a drain electrode of transistor 132. A source electrode of transistor 134 is coupled to supply voltage $V_{SS}$.

The function of output buffer 28 is to take a CMOS voltage level existing in circuit 20 and buffer the CMOS voltage to a tri-state output. The tri-state output of buffer 28 may be either totally powered down and off, a CMOS level output or a TTL level output which includes not having the TTL levels to pull up to full $V_{DD}$ potential. Output buffer 28 has a selectable digital ground and makes its own high level output five volts above the selected digital ground.

In operation, when output buffer 28 is providing a TTL output signal, the TTL mode control signal is at a logic high level and the CMOS mode control signal is at a logic low level. A low logic level CMOS mode control signal locks the output of NAND gate 106 at a high logic level regardless of the input data. Transistor 112 is therefore nonconducting. Simultaneously, the output of NOR gate 108 is locked at a low logic level regardless of the input data. Transistor 114 is therefore also nonconducting. The output of inverter 120 is at a logic low level so that switch 122 is turned on by the TTL mode control signal and its complement. Simultaneously, transistor 134 is nonconducting. The function of switch 122 and transistor 134 is to properly switch the substrate of transistor 132. When in a TTL mode of operation, the substrate of transistor 132 is switched to VLS potential. If the TTL mode control signal is at a logic low level, transistor 134 is conductive and switch 122 nonconductive so that the substrate of transistor 132 is coupled to the $V_{SS}$ potential during CMOS or power down modes of operation. The purpose of switching the substrate of transistor 132 is to eliminate current paths of inherent diodes which may result from the different voltage modes of operation and to prevent unnecessary back bias of transitor 132 thereby slowing down the output signal. In the TTL mode of operation, the tri-state output is provided, in part, by the operation of NAND gate 116 and NOR gate 118. When the TTL mode control signal is present in a high logic level state, the logic level of the output of NAND gate 116 is determined by the logic level of the input data signal. Similarly, the logic level of the output of NOR gate 118 is determined by the logic level of the input data signal. When the TTL mode control signal is present in a low logic level state, the logic level of the output of NAND gate 116 is low so that transistors 128 and 130 are disabled. Simultaneously, the logic level of the output of NOR gate 118 is high so that transistor 132 is also disabled from the output and the TTL output is thus disabled. During the TTL mode of operation, transistors 124 and 126 function as a logic inverter. Transistor 130 functions as a source follower and transistor 128 functions as a pull-up device. In a preferred form, transistor 130 is intentionally fabricated with a small width to length ratio gate dimension to be a weak transistor. VLS may vary from $V_{SS}$ to $V_{DD}$ and different values thereof may be used. When VLS is less than five volts below $V_{DD}$, the VLS+5 volt supply varies with the value of VLS. When VLS is five volts less than $V_{DD}$, then the value of VLS+5 volts is equal to $V_{DD}$ volts. As VLS varies within a five volt range of $V_{DD}$, VLS+5 remains at $V_{DD}$ volts. The output voltage will not exceed VLS+5 volts even if VLS+5 volts is significantly less than $V_{DD}$ volts. The source follower transistor 130 functions as a strong pull-up device to within a P-channel threshold below VLS+5 volts. However, the pull-up device becomes softer or weaker as the voltage across transistor 130 decreases because the gate-source voltage of transistor 130 decreases. With a large gate-to-source voltage, transistor 130 pulls up the output voltage very fast. However, as the output voltage approaches the threshold voltage of transistor 130, transistor 130 begins to turn off. At a threshold voltage below VLS+5 volts, transistor 130 is no longer useful in pulling the output voltage to VLS+5 volts. Transistor 128 then pulls the output voltage to approximately VLS+5 volts. An advantage of this configuration is that the main output drive current is sourced through transistor 130 which is coupled to supply voltage $V_{DD}$. Therefore the internally generated voltage VLS+5 volts is not supplying the majority of the current. Since the current requirements of the internal power supply are not demanding, a smaller reference circuit may be used. Transistor 128 conducts when transistor 130 conducts and pulls the output voltage up to VLS+5 volts. The gate width to length dimension of transistor 130 is made large in comparison to the gate width to length dimension of transistor 128. Therefore, transistor 130 is faster than transistor 128 and will pull the output logic level quickly past VLS+2.4 volts or the output trip level. Transistor 128 then completes the output pullup.

In the CMOS mode of operation, the CMOS mode control signal is at a high logic level. The logic level of the input data determines the logic level of the outputs of NAND gate 106 and NOR gate 108. Transistors 112 and 114 function as a conventional CMOS inverter and provide a CMOS output having a logic level inverted from the logic level of the input data.

By now it should be appreciated that a TTL/CMOS voltage compatible circuit which can accomodate various power supply voltages and input and output voltage levels has been provided. A plurality of input and output buffers provide either TTL or CMOS compatible inputs and outputs in response to the value of a VLS control signal.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A circuit which may receive an input signal within a predetermined CMOS voltage levels in response to a voltage level selection signal having at least a predetermined value, and which otherwise may receive an input signal within predetermined TTL voltage level inputs, comprising:

input signal level detection means characterized by receiving said voltage level selection signal, and providing a CMOS mode control signal at a first output when said selection signal is equal to or greater than said predetermined value, and otherwise providing a TTL mode control signal at a second output;

reference voltage means characterized by receiving said selection signal at a first input and having a second input coupled to the first output of said input signal level detection means, for providing at an output a reference voltage which is referenced to the voltage of said selection signal; and input buffer means having a first input coupled to the first output of said input signal level detection means, a second input coupled to the second output of said input signal level detection means, and a third input coupled to the output of said reference voltage means, for receiving a CMOS voltage level input signal in response to said CMOS mode control signal, and for receiving a TTL voltage level input signal in response to said TTL mode control signal, said input buffer means having an output for providing an input buffer output signal within predetermined CMOS voltage levels in response to the input signal.

2. The circuit of claim 1 wherein said reference voltage means provides a second reference voltage referenced to the voltage of the selection signal at a second output, and further comprising:

output buffer means having first and second inputs coupled to the first and second outputs of said input signal level detection means, respectively, a third input for receiving a data signal, and a fourth input coupled to the second output of the reference voltage means, for providing a circuit output signal in response to the data signal, said output signal having CMOS voltage levels in response to said CMOS mode control signal, and having TTL voltage levels in response to said TTL mode control signal.

3. The circuit of claims 1 or 2 wherein said input buffer means further comprise:

a plurality of input buffers, each of which has first and second inputs coupled to the first and second outputs of the input signal level detection means, a third input coupled to the first output of said reference voltage means, and a fourth input which is coupled to a predetermined one of a plurality of input signals, each input buffer providing an input buffer output signal having CMOS voltage levels, each input buffer being able to receive an input signal having CMOS voltage levels in response to said CMOS mode control signal, and each input buffer being able to receive an input signal having TTL voltage levels in response to said TTL mode control signal.

4. A circuit for providing an output signal within predetermined CMOS voltage levels in response to a voltage level selection signal having at least a predetermined value and within predetermined TTL voltage level inputs otherwise, comprising:

input signal level detection means characterized by receiving said voltage level selection signal, and providing a CMOS mode control signal at a first output when said selection signal is equal to or greater than said predetermined value, and otherwise providing a TTL mode control signal at a second output;

reference voltage means characterized by receiving said selection signal at a first input and having a second input coupled to the first output of said input signal level detection means, for providing a reference voltage which is referenced to the voltage of said selection signal at an output; and output buffer means having a first input coupled to the first output of said input signal level detection means, a second input coupled to the second output of said input signal level detection means, a third input coupled to the output of said reference voltage means, and a fourth input for receiving an input data signal, for providing an output signal having a logic level related to the input data signal, and having CMOS voltage levels in response to said CMOS mode control signal or TTL voltage levels in response to said TTL mode control signal.

5. The circuit of claim 4 wherein said reference voltage means provides a second reference voltage referenced to the voltage of the selection signal at a second output, and further comprising:

Input buffer means having first and second inputs coupled to the first and second outputs of said input signal level detection means, respectively, and a third input coupled to the second output of said reference voltage means at a second output thereof, for accepting an input signal having a CMOS voltage level in response to said CMOS mode control signal, and for accepting a TTL voltage level input signal in response to said TTL mode control signal, and an output for providing, in response to the input signal, an input buffer output signal having voltage levels within a predetermined CMOS voltage range.

6. The circuit of claim 5 wherein said input buffer means further comprise a plurality of input buffers.

7. The circuit of claim 5 or 6 wherein said output buffer means further comprise a plurality of output buffers.

8. A circuit for receiving a CMOS input signal in response to a select signal being within a first predetermined range, and for receiving a TTL input signal in response to the select signal being within a second predetermined range, wherein the first and second predetermined ranges are adjacent one another, comprising:

input signal level detection means characterized by receiving said select signal, for detecting whether said select signal is in said first or said second predetermined range;

reference voltage means coupled to said input signal level detection means and characterized by receiving said select signal, for providing a reference voltage which is referenced to said select signal; and input buffer means coupled to said input detection means and to said reference voltage means, for receiving an input signal having a CMOS voltage level in response to said select signal being within said first predetermined range, and for receiving an input signal having a CMOS voltage level in response to said select signal being within said adjacent second predetermined range, said input buffer means providing an output signal, in response to the input signal, having a logic level within a predetermined CMOS voltage range.

9. A circuit for providing a CMOS output signal in response to a select signal being within a first predetermined range, and for providing a TTL output signal in response to said select signal being within a second predeteremined range, wherein the first and second predetermined ranges are adjacent one another, comprising:

input signal level detection means characterized by receiving said select signal, for detecting whether said select signal is in said first or said second predetermined range;

reference voltage means coupled to said input signal level detection means and adapted to receive said select signal, for providing a reference voltage which is referenced to said select signal; and output buffer means coupled to said input signal level detection means and to said reference voltage means, for receiving an input data signal and providing a circuit output signal having a logic level related to the input data signal and having CMOS voltage levels in response to said select signal being within said first predetermined range, and TTL voltage levels in response to said select signal being within said adjacent second predetermined range.

* * * * *

UNITED STATES PATENT AND TRADEMARK OFFICE
CERTIFICATE OF CORRECTION

PATENT NO. : 4,472,647
DATED : September 18, 1984
INVENTOR(S) : Allgood et al.

It is certified that error appears in the above-identified patent and that said Letters Patent is hereby corrected as shown below:

In claim 1, line 2 delete the first occurrence of "a".

In claim 5, line 5, change "Input" to --input--.

Signed and Sealed this

Nineteenth Day of February 1985

[SEAL]

Attest:

DONALD J. QUIGG

Attesting Officer　　　Acting Commissioner of Patents and Trademarks